(12) United States Patent
Van Berkel

(10) Patent No.: US 7,804,732 B2
(45) Date of Patent: Sep. 28, 2010

(54) MEMORY CONTROL WITH SELECTIVE RETENTION

(75) Inventor: Cornelis Hermanus Van Berkel, Eindhoven (NL)

(73) Assignee: ST-Ericsson SA, Geneva (CH)

( * ) Notice: Subject to any disclaimer, the term of this patent is extended or adjusted under 35 U.S.C. 154(b) by 261 days.

(21) Appl. No.: 11/575,865

(22) PCT Filed: Sep. 19, 2005

(86) PCT No.: PCT/IB2005/053062

§ 371 (c)(1),
(2), (4) Date: Mar. 20, 2008

(87) PCT Pub. No.: WO2006/033070

PCT Pub. Date: Mar. 30, 2006

(65) Prior Publication Data

US 2008/0259699 A1    Oct. 23, 2008

(30) Foreign Application Priority Data

Sep. 22, 2004   (EP)   ................................. 04104588

(51) Int. Cl.
   *G11C 5/14* (2006.01)
(52) U.S. Cl. ........................ 365/226; 365/228; 365/229; 365/189.16
(58) Field of Classification Search ................. 365/226, 365/228, 229, 189.16
   See application file for complete search history.

(56) References Cited

U.S. PATENT DOCUMENTS

| 5,615,162 | A | 3/1997 | Houston et al. |
| 5,928,365 | A | 7/1999 | Yoshida et al. |
| 6,819,621 | B2 * | 11/2004 | Koelling et al. ............. 365/227 |
| 6,925,025 | B2 * | 8/2005 | Deng et al. .................. 365/226 |
| 7,061,820 | B2 * | 6/2006 | Deng ........................... 365/227 |
| 7,227,804 | B1 * | 6/2007 | Kothandaraman et al. ... 365/229 |
| 2004/0071032 | A1 | 4/2004 | Yamaoka et al. |
| 2005/0018518 | A1 * | 1/2005 | Bhavnagarwala et al. ... 365/226 |

* cited by examiner

*Primary Examiner*—Tuan T Nguyen
*Assistant Examiner*—Toan Le

(57) ABSTRACT

The present invention relates to a memory circuit and a method of controlling data retention in the memory circuit, wherein a supply signal is selectively switched to a respective one of at least two virtual supply lines (24) each shared by a respective one of a plurality of groups (30-1 to 30-$n$) of memory cells ($C_{0,0}$ to $C_{y,z}$). The selective switching is controlled based on a global activity control signal (A), used for setting the memory circuit either into a standby state or into an active state, and a local data retention indication signal (DR1 to DRn) allocated to a dedicated group of memory cells. Thereby, the data retention part of the memory circuit can be adapted to the application and its state, and standby mode leakaged power is only dissipated in those memory cells for which data retentions actually required.

20 Claims, 2 Drawing Sheets

MEMORY CONTROL WITH SELECTIVE RETENTION

Figure 1:
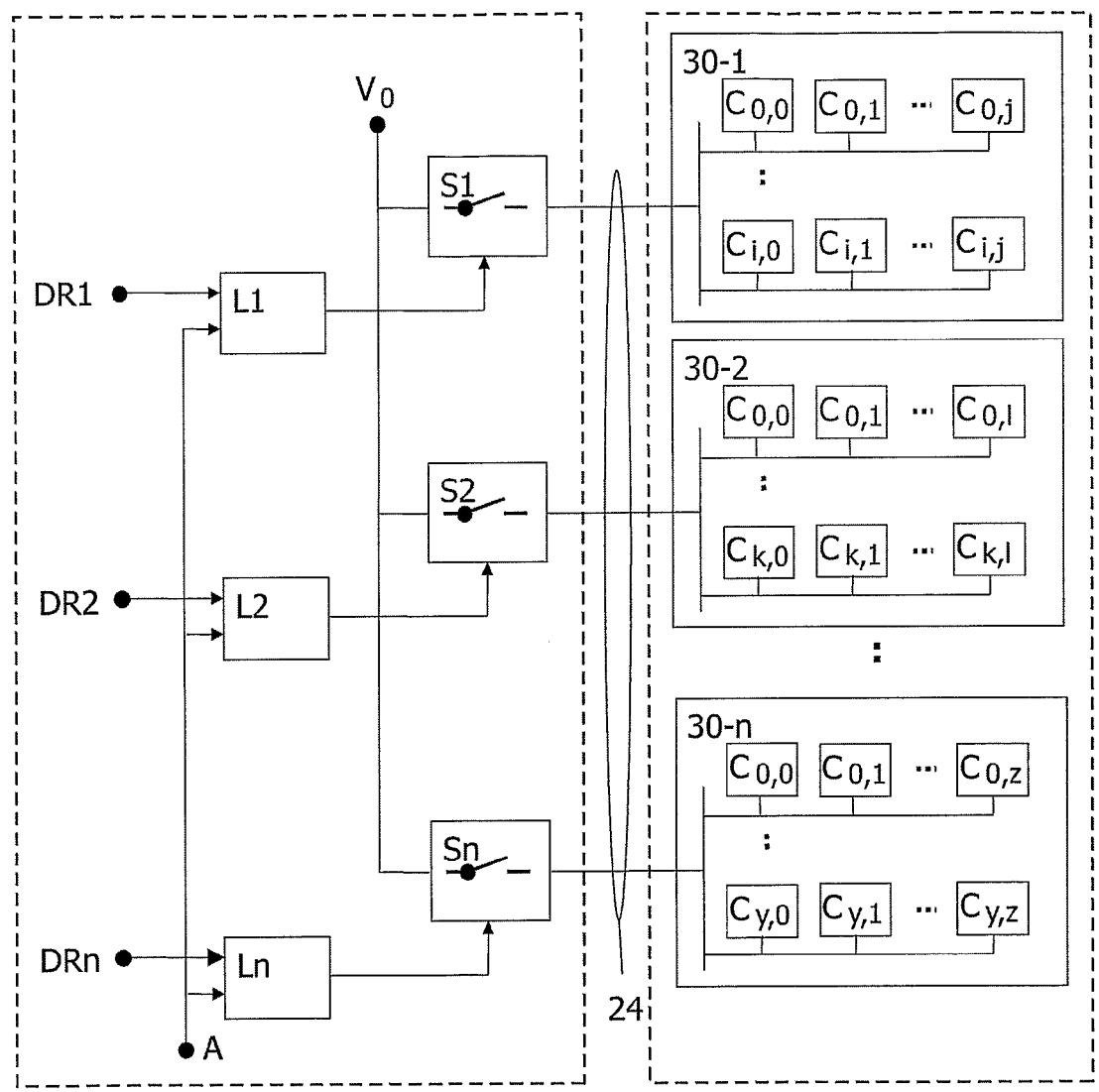

The present invention relates to a memory circuit having a plurality of memory cells for storing data, and to a method of controlling data retention in such a memory circuit.

A random access memory is generally comprised of an array of data storage locations, known as memory cells, where individual data elements, known as bits can be retained. Each memory cell can be addressed so that data from the external environment can be written into the memory cell, or data can be read from the memory cell and provided to the external environment. The time it takes to access the data in any particular memory cell is substantially independent of the location, hence the name random access memory. The word "static" in static random access memories (SRAMs) refers to the ability of the memory to retain data without having to constantly refresh or re-write the memory cells. The opposite of this is a "dynamic" random access memory (DRAM) which requires constant refreshing of the memory cells to maintain the data contained therein.

An SRAM is a volatile memory device and will thus loose all of its stored data if the power being supplied to the device is switched off.

SRAM cells can be realized using either low-threshold transistors, which are fast but have high leakage currents, or high-threshold transistors, which have low leakage currents but are slow. When the threshold value of the transistor, e.g. MOS (Metal Oxide Semiconductor) transistor is lowered, the leakage current is increased. The leakage current continues to flow at the time of operation or non-operation of the memory circuit. In the standby state, the SRAM does not perform write or read operations, but continues to hold the data. The power consumption in the standby state corresponds to the leakage current of the transistors in the circuit. When the threshold voltage of the transistors is lowered, the power consumption in the standby state is increased.

Hence, the problem of SRAM cells is that either low leakage or fast operating speed can be obtained, not both. For a combined circuit an escape from this dilemma can be achieved by means of a virtual ground using a so-called foot switch. Based on low-threshold circuitry this provides fast and high leakage operation in the active mode, where a high-threshold foot switch transistor is switched on, and low leakage in an inactive or standby mode, where the high-threshold foot-switch transistor is switched off. However, for SRAM cells this approach fails in general, as a disconnected virtual ground results in loss of memory content.

For much of the data, this memory loss is not necessarily a problem, but often some parts must be retained. For example, the SRAM may contain various data communication buffers, intermediate data, configurations, filter constants, scratch pads, cashed data, FFT (Fast Fourier Transformation) twiddle factors, etc. The question which of the SRAM data must be retained depends on the mode or state of the system at hand.

Document US 2004/0071032 A1 discloses a semiconductor memory device, in which a logic circuit is provided with a power switch so as to cut off power supply at the time of standby, reducing leakaged current. At the same time, an SRAM circuit controls a substrate bias to reduce leakaged current. A first SRAM is provided with a foot switch that can be powered down without data retention. Furthermore, a second SRAM is provided with a data retention function, wherein the substrate voltage of the transistors is controlled so as to reduce the leakage current. Thus, the whole memory circuit is divided so that some SRAMs hold data at the time of standby and other SRAMs not holding data are cut off from the power source to reduce their leakaged current. Therefore, data must be allocated a priori to a respective one of the SRAMs, depending on the need to retain data. If the status of the data is changed, this may require copying data from a data retention SRAM to a data non-retention SRAM before entering into the standby mode. Furthermore, the size relation between the retention SRAM part and the non-retention SRAM part is fixed and cannot be adapted during operation.

It is therefore and object of the present invention to provide a memory circuit and method of controlling data retention in the memory circuit, by means of which flexible data retention can be provided for selected groups of SRAM cells.

This object is achieved by a memory circuit as claimed in claim 1, and by a control method as claimed in claim 11.

Accordingly, a fine grained selection between retention and non-retention modes can be performed during run-time by means of the local data retention information. On one hand, this allows for example to adapt the size of the SRAM part that has to retain data to the application and its state. On the other hand, the locations of data items and data structures in physical memory can be adapted as well. Moreover, the data retention information can be programmed as a by-product of selected write access sequences. Thereby, low threshold performance in active mode can be combined with high threshold leakage in standby mode for those memory cells for which data retention is not required according a continuously programmable selection.

The plurality of groups of memory cells may be arranged as a single integrated memory circuit.

Furthermore, the control circuits each may comprise a logic gate adapted to set the allocated switching means into an open switching state to disconnect the supply signal when the global activity control signal and the local data retention indication signal are both set into an inactive state. Furthermore, the logic gate may be adapted to set the allocated switching means into a closed state to connect the supply signal, when at least one of the global activity control signal and the local data retention indication signal is set into an active state. This implementation provides a simple solution at minor circuit modifications and only little overhead.

The local data retention indication signal may be derived from a retention information stored in at least one dedicated memory cell of the memory circuit. This provides the advantage that the local retention information can be written and read from a dedicated memory cell which may by part of the memory cells of the memory circuit so that only little additional area overhead is required. Writing means may then be provided for writing the required retention information into the at least one dedicated memory cell during a write access to at least one memory cell of a group of the memory cells associated with said at least one dedicated memory cell.

The switching means may be arranged to selectively connect the virtual supply lines to at least one of a respective ground potential and a respective supply voltage. Thereby, the switching means correspond to foot switches or head switches controlled by the control circuits.

Furthermore, at least two additional switching means may be provided for selectively switching a second supply signal to the respective one of the at least two virtual supply lines, wherein the switching state of an allocated one of at least two additional switching means may be controlled based on an additional local or global control signal. Thereby, a refined set of operating modes can be introduced, comprising for example an active fast operating mode of selective data retention and fast reading and high leakage, an active slow operating mode of selective data retention and slow reading and less or "medium" leakage, and the standby mode of low leakage and data loss.

The plurality of memory cells may be implemented by low-threshold transistors, and the switching means may be implemented by high-threshold transistors. Thereby, overall leakaged current can be minimized.

Figure 2:
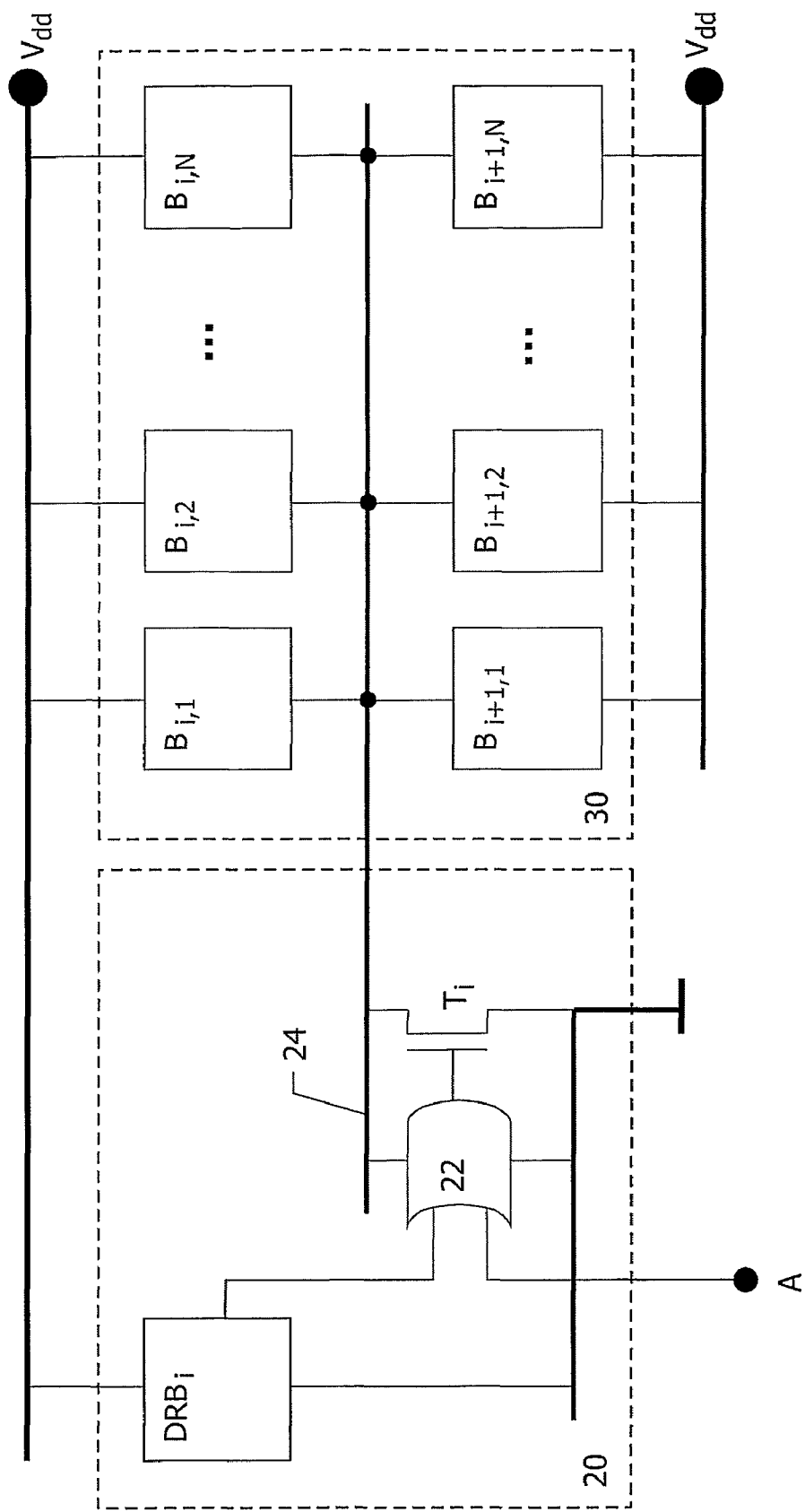

The present invention will now be described based on preferred embodiments with reference to the accompanying drawings in which:

FIG. 1 shows a schematic block diagram of a memory circuit according to the first preferred embodiment; and FIG. 2 shows a schematic circuit diagram of an implementation example of a data retention control for a dedicated group of memory cells according to the first preferred embodiment.

The preferred embodiments will now be described on the basis of an SRAM circuitry, such as an embedded SRAM for power critical applications.

FIG. 1 shows a schematic block diagram of the SRAM architecture according to the first preferred embodiment, which may be arranged as an integrated memory circuit and which comprises a memory part indicated by the dotted box on the right hand portion of FIG. 1 and being portioned into groups 30-1 to 30-n of SRAM cells $C_{0,0}$ to $C_{y,z}$. Each group is controlled by a dedicated control circuitry which comprises an input terminal for a data retention indicator DR1 to DRn, a logic unit L1 to Ln and a gate or switching unit S1 to Sn. Furthermore, the control circuitry also receives a global activity control signal A provided for setting the memory circuit either into a standby state or mode or into an active state or mode. The number of memory cells in each of the groups 30-1 to 30-n can be selected as desired and determines the granularity of retention control. The individual memory cells $C_{0,0}$ to $C_{y,z}$ are connected to first power supply lines (not shown in FIG. 1) and to respective virtual supply lines 24 which can be selectively switched by the switching units S1 to Sn to a reference potential $V_0$ which may be ground potential (i.e. "virtual ground"), for example. As an alternative, the first power supply lines may be connected to ground potential and the switched virtual supply line may be selectively connected to a pre-determined supply voltage (i.e. "virtual supply"). As a further alternative, the above concepts of virtual ground and virtual supply may be combined in one memory circuit.

In particular, the number of SRAM cells in each of the groups 30-1 to 30-n may be identical or may differ from group to group. The number of SRAM cells is a trade-off between the required granularity of data-retention control on the one hand and the area overhead resulting from the additional control circuitry on the other hand. In the case of 32 SRAM cells per group, the silicon-area overhead of the integrated circuit amounts to only a few percent. Therefore, a group size of a low number of SRAM words can be implemented in practical applications.

The control circuitry indicated by the dotted box in the left hand portion of FIG. 1 is arranged to maintain the groups 30-1 to 30-n of SRAM cells active, i.e. data is retained, when the global activity control signal A is high or in an active state or when respective one of the local data-retention indicators DR1 to DRn is high. On the other hand, the control circuit is arranged to maintain the groups 30-1 to 30-n of the SRAM cells in a standby mode, i.e. data is lost, when the global activity control signal A is low or in an inactive state and when the respective one of the local data retention indicators DR1 to DRn is low or in an inactive state.

According to the first preferred embodiment, the control circuitry may automatically update the respective one of the data retention indicators DR1 to DRn during a write access to a specific group of SRAM cells with which it is associated. During each write access the value of a global data-retention input (not shown) is then copied into the addressed data-retention indicator. For example, when constants are loaded into the SRAM circuit from an external flash memory, the global data-retention signal is kept high, and the local data retention indicator of all addressed groups of data words will be set to an active state so as to retain the written data during the standby mode. When the global data retention signal is subsequently set into a low or inactive state, other groups of words that are used for example for intermediate data or input/output buffers will not be retained during the standby mode. Thereby, data retention can be provided for selected groups of SRAM cells, with low leakage for all other non-selected SRAM as well as other SRAM circuitry, such as column decoders, row decoders, address buffers, etc. in a standby mode.

As can be gathered from FIG. 1 the proposed solution can be provided with simple modifications by providing the switching units S1 to Sn and the logic units L1 to Ln for selection of specific groups of SRAM cells. As a result, in standby mode, leakage power is only dissipated in those SRAM cells for which data retention is actually required.

The logic units L1 to Ln in FIG. 1 can be implemented by any logic circuitry which provides the above logic functionality. The switching units S1 to Sn may be implemented by any suitable semiconductor switching element which can be integrated in the memory circuit. The data retention indicators DR1 to DRn may be applied externally or may be derived from an information generated at or in the memory circuit.

FIG. 2 shows a specific implementation example of one of the control circuits of FIG. 1 for controlling a group of memory cells, which in the present example consists of a pair of SRAM words of N bits $B_{i1}$ to $B_{iN}$ and $B_{i+1,1}$ to $B_{i+1,N}$ wherein each bit is stored in a dedicated SRAM cell. The arrangement is divided into a memory portion 30 and a control portion 20. In the present example, a ground potential $V_{ss}$ is selectively gated using a so-called foot switch implemented by an NMOS transistor $T_i$ which is controlled by a logic OR gate 22 which provides an active output signal as soon as at least one of its input signals is in an active state. The NMOS transistor $T_i$ and the OR gate 22 are connected between the virtual supply line 24 of the controlled group of SRAM cells and a supply line connected to ground potential. The OR gate 22 corresponds to one of the logic units L1 to Ln of FIG. 1, while the NMOS transistor $T_i$ corresponds to one of the switching units S1 to Sn. The respective data retention indicator $DR_i$ is derived from a dedicated memory cell for storing a data retention bit $DRB_i$ and is supplied to one of the input terminals of the OR gate 22. The other input terminal of the OR gate 22 receives the global activity control signal A. The SRAM cells of the controlled group are connected to respective power supply lines to which a voltage $V_{dd}$ is supplied. The NMOS transistor $T_i$ is realized by means of a wide (low resistance) high threshold and thus low leakage transistor and provides a so-called virtual ground. As an alternative, a virtual supply or a combination of virtual ground and virtual supply can be provided by means of a wide high threshold PMOS transistor which is connected to the supply voltage $V_{dd}$, or respectively by means of a combination of both NMOS and PMOS transistors All SRAM cells of the memory portion 30 are realized using low-threshold transistor, and the groups of SRAM cells, which may as well consist of a single word or a few words with adjacent addresses, share a virtual ground signal provided by the shared foot switch transistor $T_i$. As already mentioned, in the specific example of FIG. 2, the group size equals two SRAM words and a gated supply voltage $V_{ss}$ is applied by means of the NMOS foot switch transistor $T_i$, which can be set into two states:

An open state, where the group SRAM cells operate in normal mode, i.e. fast but with a high leakage;

A closed state, where the group of SRAM cells loose their content but have low leakage.

The additional data retention bit $DRB_i$ is introduced to control the foot switch transistor $T_i$ per group of words. The corresponding memory cell need not be readable from the outside. It can be written to a standby state (e.g. "0") or an active state (e.g. "1") in the course of a read and/or write action on the dedicated or controlled group of SRAM words. Furthermore, it can operate on high threshold voltage, since it is driven directly by the outputs of the row decoder, so that there are no bit lines or word lines in the critical paths. The effect of the date retention bit $DRB_i$ only takes place when the SRAM memory is turned into its standby mode, that is, when global activity control signal A is made low.

As already mentioned above in connection with FIG. 1 the controlled group of SRAM words is active and thus retains data, when the global activity control signal A is high or when the local data retention $DRB_i$ is high, wherein the logical state "high" corresponds to logical value "1" or an active state. On the other hand, the group of SRAM words is in a standby mode and thus looses data, when the global activity control signal A is low and when the local data retention bit $DRB_i$ is low, wherein the logical state "low" corresponds to the logical value "0" or the inactive state.

The above logic functionality can be achieved by the simple OR gate which can be realized with high threshold transistors.

All other SRAM sub-circuits, such as column decoders, row decoders, address buffers, etc. are either realized using high-threshold transistors, when their performance is not critical for read/write access in the active mode, or low-threshold transistors when the timing is critical. In the latter case, foot switches under direct control can be used to minimize the standby power.

The programming of the individual data retention bits $DRB_i$ of the whole memory circuit can be organized as a by-product or in the course of a write access to the SRAM words which are controlled by the respective data retention bits $DRB_i$. Then during each write access, the value of global data retention input signal is copied into the SRAM cell of the data retention bit $DRB_i$.

Alternatively or additionally, the programming of the date retention bits $DRB_i$ could be linked to a read action of one of the SRAM words which it controls.

Furthermore, the memory circuit may be controlled by more than one global activity control signal $A_i$ which can be combined with more than one DRB bit. Thereby, multiple modes with different subsets of memory cell groups can be supported in a data-retention mode.

Finally, according to a second preferred embodiment, three operation modes could be introduced instead of the above mentioned two operating modes per group of SRAM cells, namely the active mode of selective data retention and leakage and the standby mode of selective low leakage and data loss. The three operating modes could be refined into an active fast operating mode of selective data retention and fast reading and high leakage, an active slow operating mode of selective data retention and slow reading and less or "medium" leakage, and the standby mode of low leakage and data loss. This could be achieved by a second foot switch arranged for example in series with the above first foot switch and connected to a lower or medium threshold voltage which allows sufficient margin between the supply and the virtual ground to retain data. The memory read operation can then either be supported directly, i.e. slow, or by switching the memory into the active fast mode first. This second foot switch could be controlled globally or by an additional local DRB bit.

It is noted that the present invention is not restricted to the above preferred embodiments but can be used in any volatile memory circuit to reduce leakage current in the standby mode. The invention can be applied to embedded memory circuits for power critical products in general and more specifically to data memories, cashes, streaming buffers, etc. of digital signal processors or the like. The preferred embodiments may thus vary within the scope of the attached claims.

It must further be noted that the term "comprising" when used in the specification including the claims is intended to specify the presence of stated features, means, steps or components, but does not exclude the presence or addition of one or more other features, means, steps or components or groups thereof. Furthermore, the word "a" or "an" preceding an element in a claim does not exclude the presence of a plurality of such elements. Moreover, any reference sign does not limit the scope of the claims.

The invention claimed is:

1. A memory circuit having a plurality of memory cells for storing data, said memory circuit comprising:
   at least two virtual supply lines each shared by a respective group of said memory cells;
   at least two switches configured to selectively switch a supply signal to a respective one of said at least two virtual supply lines;
   at least two control circuits configured to receive (i) a global activity control signal used for setting said memory circuit either into a standby or into an active state and (ii) a local data retention indication signal, the at least two control circuits further configured to control the switching state of an allocated one of said at least two switches based on said global activity control signal and said local data retention indication signal; and
   at least two additional switches configured to selectively switch a second supply signal to said respective one of said at least two virtual supply lines, wherein the switching state of an allocated one of said at least two additional switches is controlled based on an additional local or global control signal.

2. A memory circuit according to claim 1, wherein said plurality of memory cells are arranged as a single integrated memory circuit.

3. A memory circuit according to claim 1, wherein said control circuits each comprise a logic gate adapted to set said allocated switches into an open switching state to disconnect said supply signal, when said global activity control signal and said local data retention indication signal are both set into an inactive state.

4. A memory circuit according to claim 3, wherein said logic gate is adapted to set said allocated switches into a closed state to connect said supply signal, when at least one of said global activity control signal and said local data retention indication signal is set into an active state.

5. A memory circuit according to claim 1, wherein said memory circuit is an integrated static random access memory circuit.

6. A memory circuit according to claim 1, wherein said local data retention indication signal is derived from a retention information stored in at least one dedicated memory cell of said memory circuit.

7. A memory circuit according to claim 6, wherein said retention information is written into said at least one dedicated memory cell during a write access to at least one memory cell of a group of said memory cells associated with said at least one dedicated memory cell.

8. A memory circuit according to claim 1, wherein said switches are arranged to selectively connect said virtual supply lines to at least one of a respective ground potential and a respective supply voltage.

9. A memory circuit according to claim 1 wherein said plurality of memory cells are implemented by low-threshold transistors and said switches are implemented by high-threshold transistors.

10. A method of controlling data retention in a memory circuit, said method comprising the steps of:
    selectively switching a first supply signal to a respective one of at least two virtual supply lines each shared by a respective one of a plurality of groups of memory cells;
    selectively switching a second supply signal to said respective one of said at least two virtual supply lines;
    controlling said first switching step based on a global activity control signal, used for setting said memory circuit either into a standby state or into an active state, and a first local data retention indication signal allocated to a dedicated group of memory cells; and
    controlling said second switching step based on said global activity control signal and a second local data retention indication signal allocated to said dedicated group of memory cells.

11. A method according to claim 10, wherein said plurality of groups of memory cells are arranged as a single integrated memory circuit.

12. A method according to claim 10, wherein at least one of controlling said first switching step and controlling said second switching step comprises disconnecting said supply signal from said respective virtual supply line when said global activity control signal and said local data retention indication signal are both set into an inactive state.

13. A method according to claim 12, wherein said at least one of controlling said first switching step and controlling said second switching step comprises connecting said supply signal to said respective virtual supply line when at least one of said global activity control signal and said local data retention indication signal is set into an active state.

14. A method according to claim 10, further comprising:
    deriving at least one of said first local data retention indication signal and said second local data retention indication signal from retention information stored in at least one dedicated memory cell of said memory circuit.

15. A method according to claim 14, further comprising:
    writing the retention information into said at least one dedicated memory cell during a write access to at least one memory cell of a group of said memory cells associated with said at least one dedicated memory cell.

16. A method according to claim 10, wherein at least one of said first switching step and said second switching step comprises selectively connecting said virtual supply lines to at least one of a respective ground potential and a respective supply voltage.

17. An integrated memory circuit comprising:
    a plurality of groups of memory cells;
    at least two virtual supply lines each shared by a respective group of said memory cells;
    at least two first switches configured to selectively switch a first supply signal to a respective one of said at least two virtual supply lines;
    at least two second switches configured to selectively switch a second supply signal to said respective one of said at least two virtual supply lines; and
    at least two control circuits configured to receive (i) a global activity control signal used for setting said memory circuit either into a standby or into an active state, (ii) a first local data retention indication signal, and (iii) a second local data retention indication signal,
    wherein said at least two control circuits are configured to:
        control an associated one of said at least two first switches based on said global activity control signal and said first local data retention indication signal; and
        control an associated one of said at least two second switches based on said global activity control signal and said second local data retention indication signal.

18. An integrated memory circuit according to claim 17, wherein said control circuits each comprise a logic gate adapted to set said associated switches into a closed state to connect said supply signal, when at least one of said global activity control signal and said local data retention indication signal is in an active state.

19. An integrated memory circuit according to claim 17, wherein at least one of said first and second local data retention indication signals is derived from retention information stored in at least one dedicated memory cell of said integrated memory circuit.

20. An integrated memory circuit according to claim 19, wherein said retention information is written into said at least one dedicated memory cell during a write access to at least one memory cell of a group of said memory cells associated with said at least one dedicated memory cell.

* * * * *